(12) United States Patent
Mushika

(10) Patent No.: US 7,081,647 B2
(45) Date of Patent: Jul. 25, 2006

(54) MICROELECTROMECHANICAL SYSTEM AND METHOD FOR FABRICATING THE SAME

(75) Inventor: Yoshihiro Mushika, Neyagawa (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 0 days.

(21) Appl. No.: 10/942,614

(22) Filed: Sep. 16, 2004

(65) Prior Publication Data

US 2005/0067633 A1 Mar. 31, 2005

(30) Foreign Application Priority Data

Sep. 29, 2003 (JP) ............................. 2003-336990

(51) Int. Cl.
*H01L 27/148* (2006.01)
*H01L 27/14* (2006.01)
*H01L 21/00* (2006.01)

(52) U.S. Cl. ...................... 257/222; 257/225; 257/226; 257/252; 257/414; 438/48; 438/50

(58) Field of Classification Search ................ 257/222, 257/225, 226, 252, 254, 414, 415; 438/48, 438/50, 51–53
See application file for complete search history.

(56) References Cited

U.S. PATENT DOCUMENTS

2001/0027019 A1 10/2001 Ishii et al.

2003/0034535 A1* 2/2003 Barenburg et al. .......... 257/415

OTHER PUBLICATIONS

Bustillo, et al., "Surface Micromachining for Microelectromechanical Systems", *Proceedings of the IEEE*, vol. 86, No. 8, pp. 1552-1574 (Aug. 1998).

Liu, et al., "Effects of Ti Addition on the Morphology, Interfacial Reaction, and Diffusion of Cu and $SiO_2$", *J. Vac. Sci. Technol.*, vol. B 20, No. 6, pp. 2361-2366 (Nov./Dec. 2002).

Lakdawala, et al., "Micromachined High- Q Inductors in a 0.18-µm Copper Interconnect Low-K Dielectric CMOS Process", *IEEE Journal of Solid-State Circuits*, vol. 37, No. 3, pp. 394-403 (Mar. 2002).

* cited by examiner

*Primary Examiner*—Hsien Ming Lee
(74) *Attorney, Agent, or Firm*—Akin Gump Strauss Hauer & Feld, LLP

(57) ABSTRACT

A microelectromechanical system includes a substrate, a transducer supported on the substrate and a conductor layer, which is also supported on the substrate and electrically connected to the transducer. The transducer includes a portion made of silicon or a silicon compound. The conductor layer is made of a refractory conductor, which includes, as its main ingredient, at least one element selected from the group consisting of copper, gold and silver. At least a portion of the conductor layer is located at an intermediate level between the silicon or silicon compound portion of the transducer and the substrate.

21 Claims, 4 Drawing Sheets

MICROELECTROMECHANICAL SYSTEM AND METHOD FOR FABRICATING THE SAME

BACKGROUND OF THE INVENTION

1. Field of the Invention

The present invention relates to a microelectromechanical system, in which a transducer and an interconnect portion for electrically connecting the transducer to an external device are integrated together on the same substrate, and also relates to a method for fabricating such a system.

2. Description of the Related Art

Microelectromechanical systems (MEMS), including a transducer and a controller that are integrated together on the same substrate, have recently been researched and developed extensively. As used herein, the "transducer" means an element having the function of converting electrical energy into energy in another form and/or vice versa. A micro actuator and a micro sensor, at least part of which is a physically deformable structure, are typical transducers for converting electrical energy into mechanical energy.

A MEMS of that type is fabricated by providing a controller on a substrate first and then forming a transducer on the same substrate. Accordingly, if the process step of forming the transducer must be carried out at an elevated temperature, then the controller may deteriorate due to the heat, which is a problem.

Generally speaking, the transducer needs to exceed a standard level in terms of residual stress, creep strength, abrasion resistance, fatigue failure resistance and surface roughness. A normal LSI fabricated by a semiconductor device manufacturing process needs to exhibit none of these mechanical properties. To obtain a transducer with these mechanical properties improved, thin film deposition and annealing process steps, which should be carried out at high temperatures, are often essential parts of its manufacturing process. For example, polysilicon, which is now being researched most extensively as one of the most suitable materials for a MEMS, needs to be annealed at least at 600° C. for 150 minutes, or at 1,050° C. for 30 minutes, to obtain a film of quality with little residual stress. It is known that the residual stress of a silicon nitride can be reduced to 10 MPa or less if the silicon nitride has a silicon-rich composition and if the silicon nitride is annealed within an oxygen atmosphere. In that case, however, the silicon nitride still needs to be annealed at a temperature of 825° C. to 850° C. for at least 180 minutes. Also, lead zirconate titanate (PZT), which is a typical ferroelectric oxide, needs to be thermally treated at temperature of 600° C. to 650° C. to align crystalline phases of PZT. And a silicon carbide, having extremely high mechanical-chemical strength, has to be deposited at a temperature of 750° C. to 800° C. As is well known in the art, polysilicon, silicon nitride, lead zirconate titanate, and silicon carbide have excellent material properties and are often used in semiconductor device processing but need to be thermally treated at least at 600° C. when used as a material for a good transducer structure.

Meanwhile, the controller of a normal CMOS circuit has a thermal resistance of at most about 450° C. to about 525° C. Accordingly, if the transducer, requiring such a high-temperature process, were formed after the controller has been provided, then the controller might be damaged.

It is known that the controller is damaged mainly because an aluminum alloy, which is usually used in the interconnect portion thereof, increases its resistance so much as to be disconnected. Aluminum has as low a melting point as 660° C. Accordingly, once the controller including aluminum or an alloy thereof is complete, no high temperature process may be carried out at a temperature of about 660° C. or more. In addition, even at a temperature lower than 660° C., aluminum is likely to create voids due to grain growth or atomic diffusion. Thus, if the interconnects of the controller are made of aluminum with such a low melting point, then the interconnects would deteriorate while the transducer is being fabricated. For that reason, when aluminum is used as an interconnect material for the controller, the transducer needs to be fabricated in such a temperature range that would not deteriorate the aluminum interconnects. That is to say, the temperature at which the aluminum interconnects start to deteriorate defines the thermal resistance of the controller.

To increase the thermal resistance of the controller, aluminum may be replaced with tungsten, which is a refractory metal well known in the field of semiconductor integrated circuit technologies (see J. M. Bustillo, R. T. Howe and R. S. Muller, "Surface Micromachining for Microelectromechanical Systems", Proceedings of the IEEE, Vol. 86, No. 8, pp. 1552–1574 (August 1998)(FIG. 4, in particular)). Bustillo et al. discloses a MEMS including a controller, in which the conductor is made of tungsten, and a transducer including a polysilicon portion. In this MEMS, polysilicon as the transducer material is annealed at as high a temperature as 1,050° C. for one hour and the controller can resist such a high-temperature process.

Meanwhile, in manufacturing a normal LSI, a damascene process, in which excessive portions of a conductor are removed by chemical mechanical polishing (CMP), is used extensively today. When this damascene process is adopted, a copper-based material, which has been too difficult to etch to adopt in semiconductor device processing, can be used. The damascene process makes it possible to form very small interconnects without being affected by the topology of lower-level interconnects. Copper has lower resistivity than aluminum. Accordingly, by using copper interconnects, the electrical resistance of the interconnects can be reduced and the operating frequency of the CPU can be increased.

The copper interconnect includes a barrier layer of titanium nitride to prevent the diffusion of copper atoms. The critical thickness of the barrier layer is defined such that the resistivity of the copper interconnect with the barrier layer is lower than that of the aluminum interconnect without the barrier layer. In this case, the resistivity of aluminum is 1.58 times as high as that of copper. In the prior art, however, the copper interconnects obtained by the damascene process are used only as very small interconnects that satisfy a design rule of 0.25 μm, and therefore, the barrier layer thereof needs to have a thickness of 40 nm or less, which is an extremely small value.

It is also known that when 2.98 wt % of titanium is added to copper, the grain growth of the copper can be minimized even during an annealing process at 800° C. (see, for example, C. J. Liu, J. S. Jeng and J. S. Chen, "Effects of Ti addition on the morphology, interfacial reaction, and diffusion of Cu on $SiO_2$", Journal of Vacuum Science & Technology B, Vol. 20, No. 6, pp. 2361–2366 (November/December 2002)).

The damascene process is sometimes applied to micromachining (see, for example, H. Lakdawala et al., "Micromachined High-Q Inductors in a 0.18-μm Copper Interconnect Low-K Dielectric CMOS Process", IEEE Journal of Solid-State Circuits, Vol. 37, No. 3, pp. 394–403 (March 2002)). Lakdawala et al. discloses a configuration in which a stack of 0.18 μm copper interconnects and a low-k interlayer dielectric film is used as an inductor, the low-k interlayer dielectric film is removed by an anisotropic etching process with the uppermost metal layer used as a mask, and then the substrate is selectively etched isotropically to define a hollow structure under the inductor.

In the configuration disclosed by Bustillo et al., however, tungsten as the conductor has high resistance, which also varies greatly with the temperature. Accordingly, the loss and resistance variation of a long interconnect are particularly significant. As a result, the operating speed of the MEMS decreases, the power dissipation thereof increases or the operating characteristics of the element change with the temperature characteristic of the interconnects.

As for the copper interconnects for use in a normal LSI, the diffusion of copper atoms needs to be prevented with the barrier layer that is as thin as 40 nm or less. Accordingly, strict process control must be carried out to adapt the copper interconnects to a high-temperature long process. The diffusion path of the copper atoms in the barrier layer is mainly located in the grain boundary of the barrier material. For that reason, to enhance the anti-diffusion effects, it is particularly effective to increase the grain sizes of the barrier material and align the crystal directions between the grains. However, when the barrier layer is thin, most of the atoms in the barrier layer are subject to interfacial effects produced between the barrier layer and the insulating film, and therefore, tend to have decreased grain sizes and randomized crystal directions. To avoid these situations with good reliability, strict control and test of the interconnect quality are needed.

Also, if about 2.98 wt % of titanium is added to copper to minimize the grain growth of that copper, then the specific resistance of the copper becomes 5 $\mu\Omega$cm, which is greater than the specific resistance of aluminum of 2.7 $\mu\Omega$cm. Thus, this technique does not contribute effectively to achieving a lower resistance than that of aluminum.

Lakdawala et al. proposed that the damascene process be applied to making a micro machine. According to his method, the inductor corresponding to the transducer is formed by a low-temperature process. But Lakdawala et al. is silent about what configuration should be used when the transducer needs a high-temperature process. Also, according to the technique of Lakdawala et al., the interlayer dielectric film is patterned by an anisotropic etching process, and then the silicon substrate is selectively etched isotropically to define a hollow structure. Thus, only transducers with a very simple structure can be obtained. In addition, the portions of the silicon substrate to be etched away cannot be fixed definitely. Consequently, it is difficult to prevent the controller from being damaged by over-etching or the transducer from losing its reliability due to under-etching.

SUMMARY OF THE INVENTION

In order to overcome the problems described above, an object of the present invention is to provide a microelectromechanical system, which prevents the interconnects from being damaged even at a high temperature, ensures good transducer performance, and reduces the wiring resistance, and a method for fabricating such a system.

Another object of the present invention is to provide a microelectromechanical system, in which transducers of a complex shape are formed with good reliability and at a reduced cost, and a method for fabricating such a system.

A microelectromechanical system according to a preferred embodiment of the present invention includes: a substrate; a transducer supported on the substrate; and a conductor layer, which is also supported on the substrate and electrically connected to the transducer. The transducer includes a portion made of silicon or a silicon compound. The conductor layer is made of a refractory conductor, which includes, as its main ingredient, at least one element selected from the group consisting of copper, gold and silver. At least a portion of the conductor layer is located at an intermediate level between the silicon or silicon compound portion of the transducer and the substrate.

In one preferred embodiment of the present invention, the transducer includes: a structure including the silicon or silicon compound portion; and a gap surrounding the structure, and a portion of the conductor layer is located under the structure.

In another preferred embodiment, the silicon or silicon compound portion of the transducer is made of polysilicon, silicon nitride, lead titanate zirconate and/or silicon carbide.

In still another preferred embodiment, the refractory conductor includes 0.1 wt % to 1.0 wt % of Ti, Ta, W, Mo or Si.

In yet another preferred embodiment, the surface of the refractory conductor is covered with a barrier layer with a thickness of at least 50 nm.

In this particular preferred embodiment, the barrier layer includes a metal selected from the group consisting of Ti, W, Ta and Re, a nitride of the metal, and/or a silicide of the metal.

In yet another preferred embodiment, the conductor layer includes an interconnection pattern, which has a minimum line width of 0.35 $\mu$m.

In that case, the interconnection pattern of the conductor layer includes an upper-level interconnect portion and a lower-level interconnect portion, which are provided at mutually different levels.

A microelectromechanical system according to another preferred embodiment of the present invention preferably includes a substrate and a interconnect region and a transducer region, which are both supported on the substrate. The interconnect region includes a plurality of conductors and an insulator provided between the conductors. The transducer region includes at least one transducer. The transducer includes a structure and a gap surrounding the structure. The microelectromechanical system further includes a barrier wall, which is provided in a boundary between the interconnect region and the transducer region so as to isolate the insulator from the gap.

In one preferred embodiment of the present invention, the insulator of the interconnect region is an unetched portion of an insulating film, which remains after the gap has been formed by etching away a portion of the insulating film functioning as a sacrificial layer.

In this particular preferred embodiment, the barrier wall is made of a material that works as a barrier against an etchant that etches the insulating film.

In another preferred embodiment, the barrier wall hermetically separates the interconnect region from the transducer region.

In still another preferred embodiment, at least a portion of the barrier wall is made of the same material as the conductor and/or the structure.

In yet another preferred embodiment, at least a portion of the conductor is made of the same material as the structure.

In yet another preferred embodiment, the conductor and the structure are formed at a time by a damascene process.

In that case, the surface of the structure is planarized so as to function as an optical reflective surface.

In yet another preferred embodiment, the transducer further includes an electrode to drive the structure, and the surface of the electrode is planarized by the damascene process and opposed to the structure with the gap provided between the electrode and the structure.

In this particular preferred embodiment, the structure is formed by a dual damascene process, and the surface of the structure that is opposed to the electrode functions as a non-planarized surface.

In yet another preferred embodiment, the microelectromechanical system further includes a conductive protective coating, which forms an integral part of the structure and/or the conductor.

In a specific preferred embodiment, the conductive protective coating includes gold and/or silver.

A MEMS fabricating method according to a preferred embodiment of the present invention is a method for fabricating a microelectromechanical system, which includes a transducer and an interconnect portion that is electrically connected to the transducer. The method preferably includes the steps of: (a) providing an insulator having a recess on a substrate; (b) filling the recess with a refractory conductor, which includes copper, gold or silver as its main ingredient, thereby forming a conductor layer; and (c) defining a structure for the transducer. The step (c) includes the step of increasing the temperature of the substrate to 600° C. or more.

In one preferred embodiment of the present invention, the step (b) includes the steps of depositing the refractory conductor over the insulator, and planarizing the refractory conductor, thereby removing excessive portions of the refractory conductor, which are located outside of the recess.

In another preferred embodiment, the step (c) includes the step of making at least a portion of the structure of polysilicon, silicon nitride, lead titanate zirconate or silicon carbide.

A MEMS fabricating method according to another preferred embodiment of the present invention preferably includes the step of defining an interconnect region, a transducer region, and a barrier wall, which separates the interconnect and transducer regions from each other, on a substrate. The interconnect region includes a plurality of conductors and an insulator that is provided between the conductors. The transducer region includes a structure and a sacrificial layer surrounding the structure. The method preferably further includes the step of creating a gap by removing the sacrificial layer by an isotropic etching process. The method further includes the steps of (a) forming a stopper layer, which is resistant to the etching process, on the substrate, (b) providing the insulator and the sacrificial layer on the stopper layer, (c) defining the barrier wall, which is also resistant to the etching process, in a boundary between the insulator and the sacrificial layer so that the barrier wall is continuous with the stopper layer, (d) depositing a protective coating to protect the insulator so that the protective coating is continuous with the barrier wall and (e) etching the sacrificial layer away isotropically.

In one preferred embodiment of the present invention, the step of defining the interconnect region, transducer region and barrier wall includes the step of forming a portion of the conductor and/or a portion of the structure simultaneously with a barrier wall.

In another preferred embodiment, the step of defining the interconnect region, transducer region and barrier wall includes the step of forming the structure by a damascene process.

In this particular preferred embodiment, the step of forming the structure includes the step of planarizing the surface of the structure so that the surface becomes an optical reflective surface.

In still another preferred embodiment, the step of planarizing is carried out on the surface of the structure and/or the surface of an electrode that drives the structure. The surfaces are opposed to each other with a gap provided between them.

In this particular preferred embodiment, the step of defining the interconnect region, transducer region and barrier wall includes the step of forming the structure by a dual damascene process such that the surface of the structure, which is opposed to the electrode, becomes a non-planarized surface.

In yet another preferred embodiment, the method further includes the step of depositing first and second insulating layers so that the first and second insulating layers function as the sacrificial layer. The first and second insulating layers are stacked one upon the other so as to interpose a stopper, at least a portion of which is an opening, between themselves.

In that case, the step (e) includes the step of etching the sacrificial layer away with an etchant poured through the opening.

In a microelectromechanical system according to any of various preferred embodiments of the present invention described above, the interconnect portion is made of a conductor, which includes copper, gold or silver as its main ingredient, and the transducer is made of either silicon or a silicon compound, thereby improving the performance of the transducer with the damage on the interconnect portion minimized. As a result, the wiring resistance can be reduced.

In addition, by etching the sacrificial layer away with the barrier wall provided between the interconnect and transducer regions on the substrate so as to separate these two regions from each other, even a transducer structure with a complicated shape can be obtained easily and the reliability of the interconnect region can be increased significantly.

Other features, elements, processes, steps, characteristics and advantages of the present invention will become more apparent from the following detailed description of preferred embodiments of the present invention with reference to the attached drawings.

DETAILED DESCRIPTION OF PREFERRED EMBODIMENTS

Hereinafter, preferred embodiments of the present invention will be described with reference to the accompanying drawings.

Figure 1A:
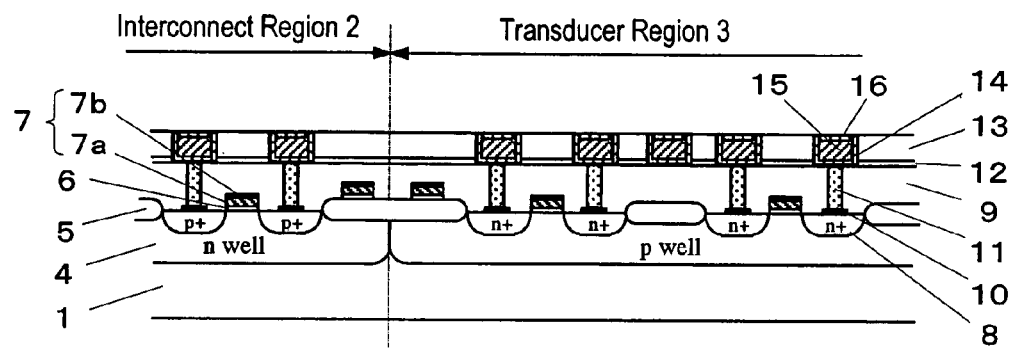
FIGS. 1A through 1E are cross-sectional views showing respective process steps for fabricating a microelectromechanical system according to a preferred embodiment of the present invention.
Figure 1B:
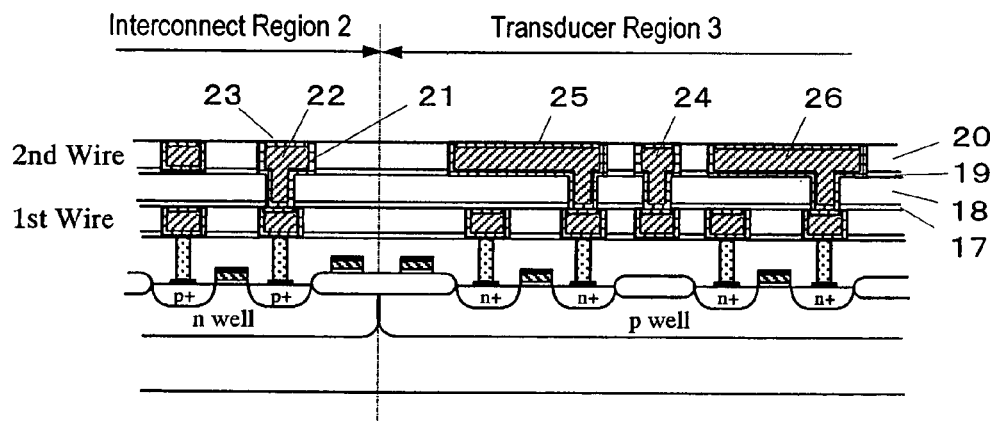
Figure 1C:
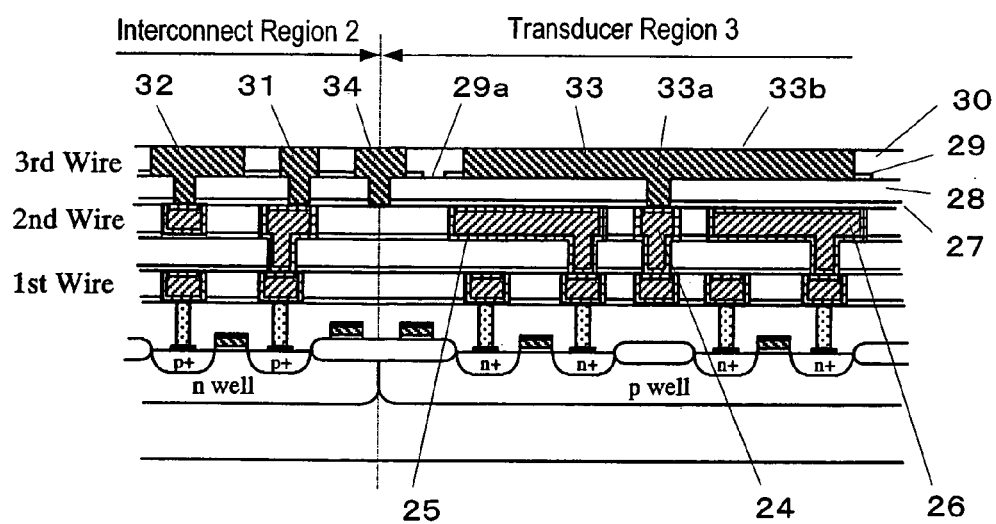

First, referring to FIGS. 1A, 1B and 1C, illustrated are partially enlarged cross-sectional views of the substrate during the first half of a manufacturing process according to this preferred embodiment.

Specifically, FIG. 1A shows a cross section of the substrate on which the process step of forming the first conductor layer has just been carried out. The substrate for use in this preferred embodiment is an n-type silicon wafer 1, on which an interconnect region 2 and a transducer region 3 will be defined.

In the interconnect region 2, a CMOS circuit or a BiCMOS circuit has preferably been provided so as to generate a drive signal for driving a transducer in response to an external input signal. In the transducer region 3 on the other hand, a plurality of transducers and a plurality of switching elements for selecting transducers to drive have preferably been provided. Each of those switching elements is preferably an NMOS transistor.

In this preferred embodiment, each of the switching elements provided in the interconnect and transducer regions 2 and 3 is preferably implemented as a transistor that has been defined on the surface of the silicon substrate 1. At least some of those switching elements may be thin-film transistors that have been defined on the silicon substrate 1. If all of those switching elements were thin-film transistors, then the substrate 1 would not have to be a single crystalline silicon substrate but might be either an insulating substrate such as a quartz substrate or a conductive substrate including an insulating layer thereon. In any case, however, the substrate would have to resist a high-temperature process to be performed to form the transducers.

This circuit is preferably fabricated by a manufacturing process with a less strict design rule of 0.35 µm or more. In this preferred embodiment, the design rule is preferably 0.5 µm. The design rule is set at least equal to 0.35 µm mainly for the purpose of increasing the resistance to a high-temperature process that has to be carried out to form the transducers. By relaxing the design rule, the thickness of the gate oxide film 6 can be increased to 7 nm or more. As a result, it is easier to cope with the decrease in effective thickness due to the diffusion of the dopant. In addition, with a sufficiently wide line width maintained, the thickness of the barrier layer 14 can be increased to 50 µm or more as will be described later.

In a normal LSI, to relax the design rule directly leads to an increase in chip area. However, such a problem is much less likely to happen in a microelectromechanical system. This is because the dominating factor that often determines the substrate size in a microelectromechanical system is not so much the circuit scale of the interconnect region 2 as the required area of the transducer region 3. For that reason, as for a microelectromechanical system, it is effective to adopt a less strict design rule than that of the state-of-the-art LSI in terms of the manufacturing cost and heat resistance.

In this preferred embodiment, the manufacturing process of the circuit described above is carried out by forming n and p wells 4, a field oxide 5, the gate oxide film 6 and gate electrodes 7 in this order on the substrate 1 by known LSI manufacturing techniques. Each of the gate electrodes 7 preferably includes a polysilicon layer 7a and a metal silicide (e.g., $TiSi_2$) layer 7b, which is provided on the polysilicon layer 7a to reduce the resistance. After the gate electrodes 7 have been formed, source/drain regions 8 are defined and an interlayer dielectric film 9 is deposited thereon.

The interlayer dielectric film 9 is preferably made of a material with high thermal resistance. In this preferred embodiment, the interlayer dielectric film 9 is preferably a silicon dioxide film deposited by a low-pressure CVD (LPCVD) process. After the surface of the interlayer dielectric film 9 has been planarized by a CMP process, via holes are opened through the interlayer dielectric film 9.

Next, after a seed layer 10 of $TiSi_2$, for example, has been deposited, those holes are filled with a metal 11 such as tungsten. Subsequently, a silicon nitride stopper 12 and an silicon dioxide interline dielectric film 13 are stacked in this order and then these two layers are etched by a reactive ion etching (RIE) process, thereby forming interconnect recesses, which will then be filled with a barrier layer 14 and a conductor 15.

As the material of the barrier layer 14, a refractory metal such as Ti, W, Ta or Re, a nitride thereof such as TiN, WN or TaN, a silicide thereof such as TiSi, TaSi or WSi or one of various ternary amorphous compounds (such as TiSiN, WSiN and TaSiN) may be selected according to the composition. In this preferred embodiment, the barrier layer 14 is preferably made of TiN. The barrier layer 14 is provided as a relatively thick film with a thickness of at least 50 nm. Accordingly, except for its portions interfacing with the interline dielectric film 13, the crystal grain size of the barrier layer 14 increases to align the crystallographic orientations with each other to a noticeably increased degree and enhance the anti-diffusion effect significantly. As a result, there is no need to perform any particularly strict process control to maintain good interconnect quality. Consequently, the interconnects can resist a heat of 850° C. for at least three hours. Optionally, the barrier layer 14 may be subjected to a stuffing process by thermally treating it at about 600° C. within an oxygen atmosphere. Alternatively, the barrier layer 14 may be a multilayer structure consisting of Ti, TiN and Ti films, for example.

The conductor 15 is either a metal such as copper, gold or silver or an alloy that includes any of these metals as a base material. Each of copper, gold and silver has a melting point of 960° C. or more, which is much higher than the melting point of 660° C. of aluminum, and has a specific resistance of 2.35 µΩcm or less, which is far lower than the specific resistance of 5.65 µΩcm of tungsten.

In this preferred embodiment, the base material is preferably alloyed in order to prevent the grain boundary from shifting and creating voids. This object is achieved by adding 0.60 wt % to 0.65 wt % of Ti to copper. By adding such an impurity, the copper crystals can be mostly aligned in <111> directions, thus minimizing the surface energy and pinning the grain boundary with Ti micro-crystals nucleated. To maintain the resistance low enough, the amount of Ti to be added preferably falls within the range of 0.1 wt % to 1 wt %. At least one more element may be selected from the group consisting of Ta, W, Mo and Si and added along with Ti.

After the excessive portions of the conductor 15, which are located outside of the recesses and on the interline dielectric film 13, have been removed by a CMP process, an upper barrier layer 16 is deposited thereon. The upper barrier layer 16 may be made of any material other than that of the barrier layer 14.

FIG. 1B is an enlarged cross-sectional view of the substrate that has just been subjected to the process step of defining the second conductor layer (which is identified by "$2^{nd}$ wire" in FIG. 1B). The conductor to fill the recesses in this process step functions as the second interconnect layer in the interconnect region 2 and as fixed electrodes 25 and 26 for a transducer in the transducer region 3. This process step of filling the recesses with the conductor is preferably carried out as a dual damascene process. More specifically, this process step is called a "trench first" method in the dual damascene process. Hereinafter, this process step will be described in detail.

First, a stopper 17, an interlayer dielectric film 18, another stopper 19 and an interline dielectric film 20 are stacked in this order on the interline dielectric film 13. In this preferred embodiment, the stoppers 17 and 19 are preferably made of silicon nitride and the interlayer and interline dielectric films 18 and 20 are preferably made of silicon dioxide.

Next, the interline dielectric film 20 is coated with a photoresist, which is subjected to exposure and development processes to define an interconnect pattern. More specifically, the photoresist is patterned so as to have openings defining the second interconnect layer and the fixed electrodes 25 and 26. Then, the interline dielectric film 20 is etched through the photoresist that has been patterned in this manner, thereby forming recesses in the same shapes as the openings and defining the interline dielectric film 20. The bottom of these recesses is defined by the stopper 19. That is to say, the stopper 19 functions as an etch stop layer while the interline dielectric film 20 is being etched.

After this photoresist pattern has been removed, the substrate is again coated with a photoresist, which is patterned so as to define via holes through exposure and development processes. That is to say, the photoresist is patterned so as to have a plurality of openings, which are located where the resultant via holes should be located and which have the same sizes as the via holes. On the bottom of those openings, the underlying stopper 19 is partially exposed. Thus, those exposed portions of the stopper 19 are removed from where the via holes should be located, and then portions of the underlying interlayer dielectric film 18 and stopper 17 are sequentially removed from the same locations. In this manner, via holes are defined so as to reach the first interconnect layer.

Next, these via holes and recesses are filled with a barrier layer 21 and a conductor 22 sequentially. More specifically, the barrier layer 21 and a film to be the conductor 22 are deposited in this order so as to cover the interline dielectric film 20 and then excessive portions of the barrier layer 21 and conductor 22, which are located outside of the via holes and recesses, are removed. In this manner, the pattern for the second interconnect layer, which is electrically connected to the lower-level interconnects by way of the via metals, is defined.

Thereafter, an upper barrier layer 23 is deposited thereon. The barrier layers 21 and 23 and conductor 22 are made of the same materials as the counterparts 14, 16 and 15 of the first interconnect layer and each exhibits high thermal resistance.

In the transducer region 3, a base 24 for supporting a movable electrode and fixed electrodes 25 and 26 for driving the movable electrode are formed while these interconnects are being formed. The upper surface of the fixed electrodes 25 and 26 is planarized by the CMP process described above. Thus, the electric field will not be concentrated in convex surface portions. And therefore, dielectric breakdown will not be produced easily between the fixed and movable electrodes as will be described later. As a result, the electrostatic breakdown strength can be increased.

When the "trench first" method is adopted, the exposure margin usually has to be narrow while a photolithographic process is being carried out to form via holes after the interconnect pattern has been defined. In this preferred embodiment, however, the design rule is so relaxed as 0.35 µm or more that this problem can be eliminated. As a result, the etching process can be carried out easily by taking advantage of that trench first method.

Next, referring to FIG. 1C, illustrated is an enlarged cross-sectional view of the substrate that has just been subjected to the process step of forming the third conductor layer of polysilicon. This conductor layer functions as the third interconnect layer in the interconnect region 2 and as the movable electrode for the transducer in the transducer region 3. This conductor layer is also formed by a dual damascene process.

This process step of forming the third conductor layer is carried out by a "middle first" method in which an intermediate stopper 29 is patterned first. This method is adopted to define openings 29a, through which an etchant will be poured while a sacrificial layer is being etched, at the same time. However, unlike the normal "middle first" method, an interline dielectric film 30 is not removed from over those openings 29a. Hereinafter, this process step will be described in detail.

First, a stopper 27, an interlayer dielectric film 28, and another stopper 29 are stacked in this order on the structure shown in FIG. 1B. In this preferred embodiment, the stoppers 27 and 29 are preferably made of silicon nitride and the interlayer dielectric film 28 is preferably made of silicon dioxide. A portion of this interlayer dielectric film 28 functions as the sacrificial layer in the transducer region 3 and will be removed by a subsequent etching process.

Next, the stopper 29 is coated with a photoresist, which is subjected to exposure and development processes to define a via pattern. More specifically, the photoresist is patterned so as to have openings defining the via holes. And the stopper 29 is patterned through these openings. In this process step, the openings 29a are also formed while the via pattern is being defined.

After the stopper 29 has been patterned, a film to be the interline dielectric film 30 is deposited. Thereafter, this film is again coated with a photoresist, which is then subjected to exposure and development processes to define an interconnect pattern. By using this patterned photoresist as an etching mask, the film to be the interline dielectric film 30 and the interlayer dielectric film 28 are etched continuously, thereby forming recesses to define the interconnect pattern. In this process step, the exposed portions of the interline dielectric film 30, which are not covered with the photoresist, are etched away, thereby defining those recesses. Furthermore, where the via openings were formed through the stopper 29, the interlayer dielectric film 28 is also etched away to define via recesses, too. These portions of the interline dielectric film 30 also function as the sacrificial layer in the transducer region 3 and will be removed by a subsequent etching process.

In the normal "middle first" method, the via openings of the stopper 29 are all located under those exposed portions of the interline dielectric film 30. That is to say, every portion of the interlayer dielectric film 28, which is located under any via opening, is removed to define a recess to be filled with the conductor 31 in the next process step.

In contrast, in this preferred embodiment, the openings 29a are located under the portions of the interline dielectric film 30 that are covered with the photoresist. Accordingly, neither the film to be the interline dielectric film 30 nor the interlayer dielectric film 28 is etched from over or under the openings 29a, which are left as they are. As a result, the openings 29a will be able to serve as etchant feeding ports in the last process step of etching the sacrificial layer.

Subsequently, after the exposed portions of the stopper 27 have been removed, the recesses between the remaining portions of the interline dielectric film 30 and the recesses that have just been formed through the interlayer dielectric film 28 are filled with the conductor 31. In this preferred embodiment, the conductor 31 is preferably n-doped polysilicon. Specifically, a polysilicon film is preferably deposited by an LPCVD process and an in-situ doping process is preferably carried out with a dopant gas of phosphine ($PH_3$), for example, mixed with a silane ($SiH_4$) gas. The polysilicon film is preferably deposited at 580° C. and then annealed at 600° C. for approximately three hours. Then, a polysilicon film with a small residual stress can be obtained.

Subsequently, the polysilicon film is planarized by a CMP process, thereby defining the conductor 31 that fills the recesses. As a result, the conductor 31 functions as the third interconnect (or conductor) layer in the interconnect region 2. This third conductor layer functions as the uppermost interconnect layer and includes terminals 32 to be connected to an external device.

In the transducer region 3 on the other hand, a portion of the polysilicon film defines a movable electrode 33 as the structure of the transducer. The movable electrode 33 is an electrostatically driven tilt mirror, which is connected and fixed to the base 24, supported so as to rotate freely around a hinge portion 33a and able to tilt rightward or leftward under static electricity produced between the fixed electrodes 25 and 26. Since the movable electrode 33 is made of polysilicon, the hinge portion 33a can exhibit excellent mechanical properties in terms of creep strength, for example.

Also, as will be described later, a reflective film will be formed on the upper surface 33b of the movable electrode 33 and used as an optical reflective surface. The upper surface 33b was planarized by the CMP process when the interconnects were defined. Accordingly, the upper surface 33b has preferred degrees of planarity and surface roughness. That is to say, in this preferred embodiment, the interconnect pattern can be defined with excessive portions of the conductor removed, and the reflectance of the optical reflective surface can be increased, by performing the CMP process a single time. In addition, polysilicon has a high degree of compatibility with the CMP process and the planarity of the upper surface 33b can be increased significantly.

In this preferred embodiment, while the conductor 31 and movable electrode 33 are being defined, a barrier wall 34 is also formed between the interconnect and transducer regions 2 and 3. That is to say, the barrier wall 34 is also made of the polysilicon filling the grooves that have been formed in the interlayer dielectric film 28 and interline dielectric film 30. In this preferred embodiment, the barrier wall 34 preferably has a closed loop shape, when looked down, so as to separate the interconnect and transducer regions 2 and 3 from each other. Thus, while the sacrificial layer of the transducer region 3 is being etched, the barrier wall 34 prevents the etchant from reaching the interconnect region 2, thereby protecting the interlayer dielectric film 28 and interline dielectric film 30 within the interconnect region 2. In other words, after gaps have been created in the transducer region 3 by selectively etching away portions of the interlayer dielectric film 28 and interline dielectric film 30, the barrier wall 34 defines the boundary between the non-etched portions of the interlayer and interline dielectric films 28 and 30 and the etched portions thereof (i.e., gaps). This function will be described more fully later when the process step of etching the sacrificial layer is described.

Hereinafter, it will be briefly described how effective it is to adopt the dual damascene process to increase the distance accuracy of the gap between the movable electrode 33 and the fixed electrodes 25 and 26. This gap distance should affect the transducer performance so significantly that it is very important to ensure good distance accuracy in the manufacturing process. Meanwhile, it is often difficult to detect the end point of the CMP process exactly, thus making it rather hard to maintain sufficiently film thickness accuracy.

In contrast, in this preferred embodiment, the upper surface of the fixed electrodes 25 and 26 and the upper surface 33b of the movable electrode 33, which need to be planarized but do not have to meet any absolute height accuracy, are supposed to be planarized by the CMP technique in the dual damascene process. On the other hand, the lower surface of the movable electrode 33, which plays a particularly important role in determining the distance accuracy of the gap, is not supposed to be planarized by the CMP technique in the dual damascene process. That is to say, the distance accuracy of the gap between the upper surface of the fixed electrodes 25 and 26 and the lower surface of the movable electrode 33 can be controlled sufficiently precisely only by the combined thickness of the interlayer dielectric film 28 and stopper 27 deposited. As a result, the variation in the characteristic of the transducers can be minimized and the overall performance of the transducers can be maximized.

Hereinafter, the latter half of the manufacturing process will be described with reference to FIGS. 1D and 1E.

Figure 1D:
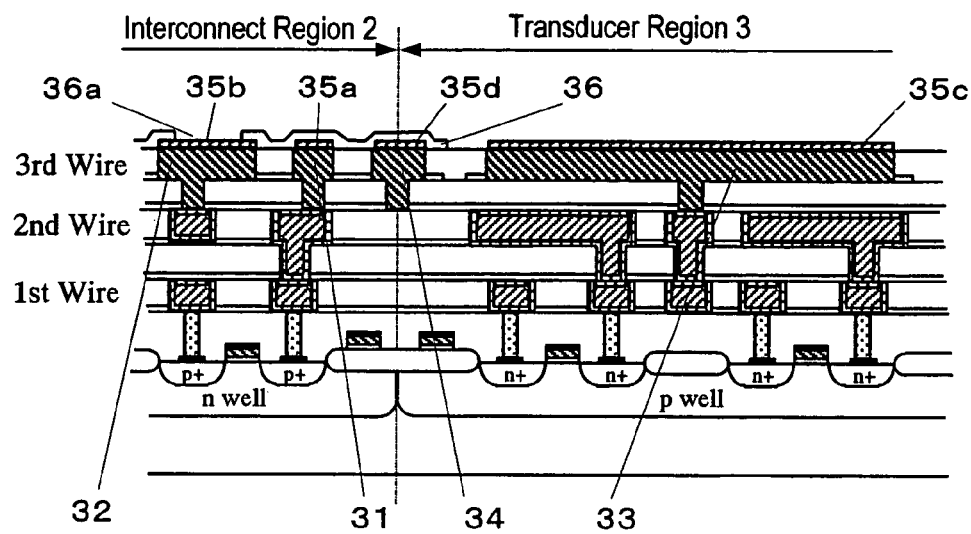

FIG. 1D is an enlarged cross-sectional view of the substrate on which two protective coatings, which are electrically conductive and insulating, respectively, have just been formed. The conductive protective coating 35 preferably has electrical conductivity and sufficient resistance to the subsequent etching process and is preferably a metal film including gold or silver. In this preferred embodiment, the conductive protective coating 35 is preferably a gold (Au) film with a purity of 4 N or more. To bond the conductive protective coating 35 to the conductor 31 of polysilicon, a thin chromium (Cr) layer is provided in the interface between them. The conductive protective coating 35 preferably has a thickness of 200 nm to 500 nm and its pattern is preferably defined by a lift-off technique. To cut down the manufacturing cost, the same photoresist pattern and the same mask as those used for defining the third interconnect layer are preferably used to define this conductive protective coating 35.

As will be described in detail later, the conductive protective coating 35 achieves the following four effects:

A portion 35a of the conductive protective coating 35, provided over the conductor 31 functioning as an interconnect, can reduce the wiring resistance effectively. Even when heavily doped, the conductor 31 of polysilicon has as high a specific resistance as 300 µΩcm or more, and cannot be used effectively as a long interconnect. However, by combining the conductor 31 with the conductive protective coating 35a with as low a specific resistance as 2.4 µΩcm, the overall resistance can be reduced significantly and the performance of the interconnect can be enhanced;

Another portion 35b of the conductive protective coating 35, provided over the external connection terminal 32, functions as a contact pad 35b to ensure sufficient corrosion resistance and reliable connection with a bonding wire. In addition, the contact pad 35b also functions as an etch stopper while openings are formed by etching the insulating protective coating 36. Furthermore, when the sacrificial layer is etched, the contact pad 35b can function as a protective coating against its etchant;

Another portion 35c of the conductive protective coating 35, provided over the movable electrode 33, functions as an optical reflective film 35c with good corrosion resistance. The Au or Ag film, among other things, can reflect visible radiation falling within a broad wavelength range with high efficiency and can increase the mirror efficiency tremendously; and The other portion 35d of the conductive protective coating 35, provided over the barrier wall 34, is highly resistible to the etchant for use to etch the sacrificial layer and can protect the interconnect region 2 effectively in cooperation with the barrier wall 34.

By making the single conductive protective coating 35 achieve these four mutually different effects from one location to another, the performance, reliability and productivity can be all improved at a time.

The insulating protective coating 36 preferably has electrical insulation property and good resistance to the process step of etching the sacrificial layer (i.e., etching resistance). In this preferred embodiment, the insulating protective coating 36 is preferably made of silicon nitride.

The insulating protective coating 36 preferably covers the entire interconnect region 2 except a contact window 36a and protects the interconnect region 2 from being etched while the sacrificial layer is being etched. On the other hand, the insulating protective coating 36 basically exposes the entire transducer region 3, thereby allowing for the sacrificial layer etching process. In the boundary between the interconnect and transducer regions 2 and 3, the insulating protective coating 36 closely contacts with the barrier wall 34 and the conductive protective coating 35d so as to shut off the sacrificial layer etchant completely.

Figure 1E:
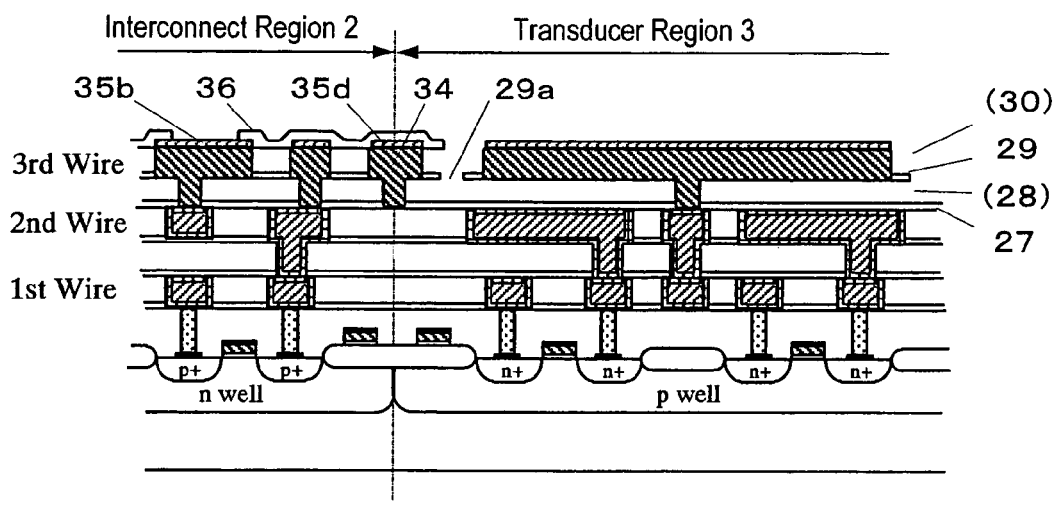

FIG. 1E is a cross-sectional view of the substrate that has just been subjected to the process step of etching the sacrificial layer.

In etching the sacrificial layer, the interlayer and interline dielectric films 28 and 30 are etched isotropically with an etchant that removes these films 28 and 30 selectively. Since the interlayer and interline dielectric films 28 and 30 of this preferred embodiment are made of silicon dioxide, an etchant such as $CF_4+H_2$ is preferably used for a dry etching process and an etchant such as HF is preferably used for a wet etching process.

The contact pad 35b, insulating protective coating 36, conductive protective coating 35d, barrier wall 34 and stopper 27 together defines a continuous and seamless anti-etching film against the etchant. Thus, the other portions that are not covered with this anti-etching film are etched away. That is to say, due to the function of the barrier wall 34 (i.e., the etching barrier effect), portions of the interlayer and interline dielectric films 28 and 30 are selectively removed from the transducer region 3 only.

The etchant enters the substrate from over it and removes the interline dielectric film 30 first. As described above, the stopper 29 already includes the openings 29a and the etchant can reach the interlayer dielectric film 28 through the openings 29a. When the interlayer dielectric film 28 is etched away completely, the etching process is finished.

After the sacrificial layer has been etched, the substrate is subjected to rinsing, drying, testing and dicing processes, and resultant chips are bonded to their packages (not shown). Thereafter, a wiring bonding process is carried out to connect the contact pads 35b of those chips to their packages. The packages are then sealed with transparent caps to obtain a complete microelectromechanical system.

As described above, in this preferred embodiment, portions of the interlayer and interline dielectric films 28 and 30, located in the transducer region, function as the sacrificial layer to create the gaps around the structure. Since the interlayer dielectric film in the interconnect region and the sacrificial layer in the transducer region are defined by the same process, the manufacturing process can be simplified.

It should be noted that the effects of the barrier wall 34 can also be achieved even when the structures in the interconnect and transducer regions are made of a metal such as aluminum. In that case, the sacrificial layer is preferably etched and the gaps are preferably created in the transducer region so as not to etch the metal such as aluminum.

Also, in the preferred embodiment described above, the barrier wall 34 is formed while the conductor identified by "$3^{rd}$ wire" is provided. However, the barrier wall 34 may also be formed by a different process step separately from such a conductor pattern.

Figure 2A:
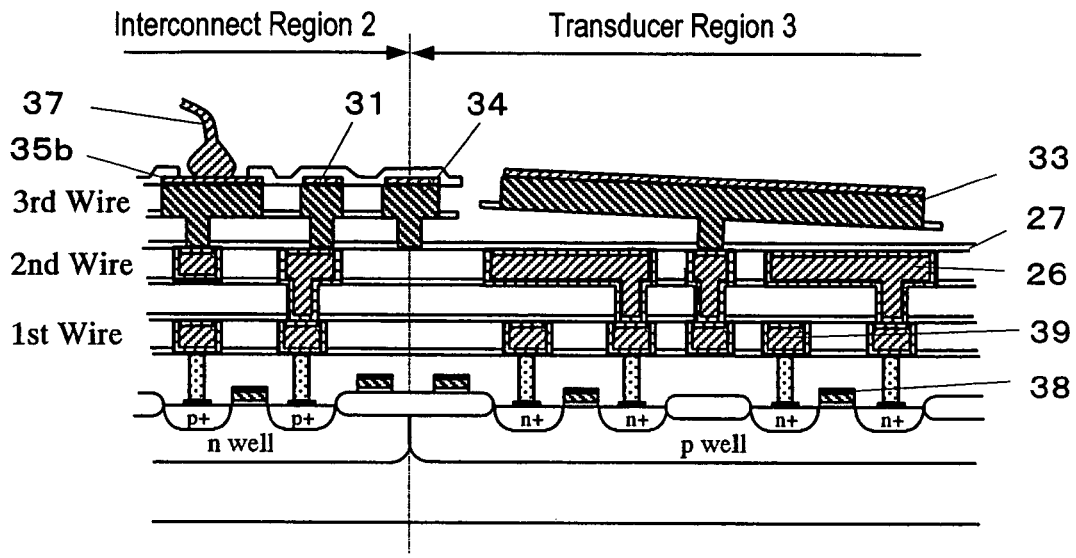
FIGS. 2A and 2B are respectively an enlarged cross-sectional view and a plan view illustrating the microelectromechanical system of the preferred embodiment of the present invention.
Figure 2B:
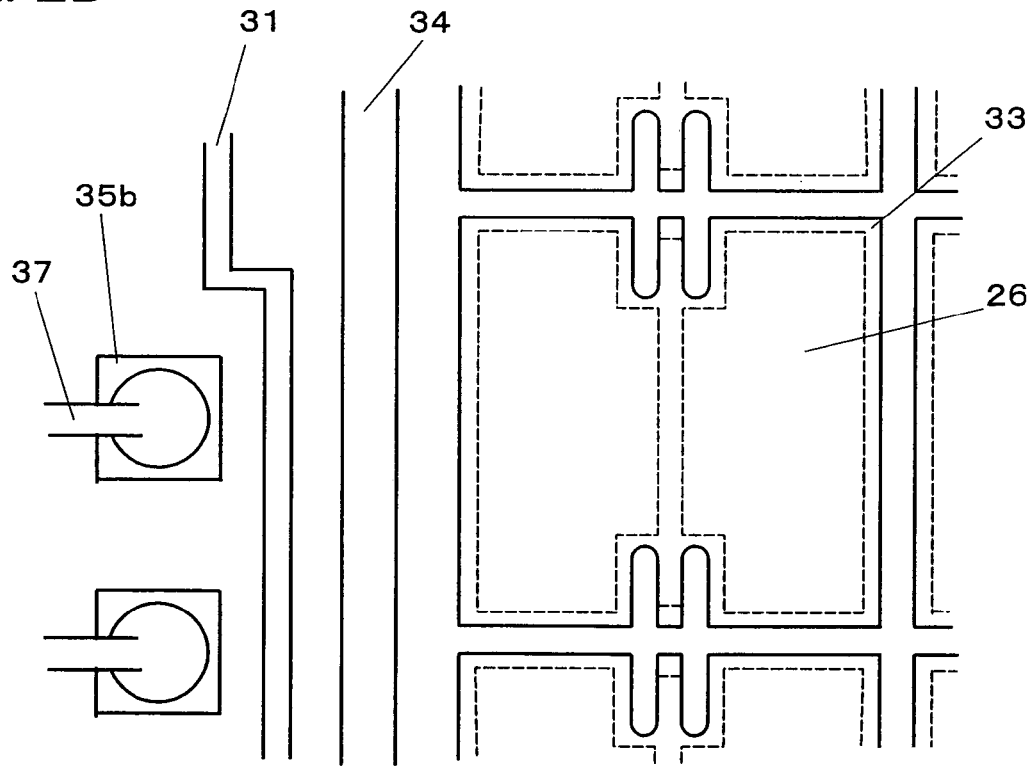

FIG. 2A is an enlarged cross-sectional view of a microelectromechanical system according to this preferred embodiment and FIG. 2B is a plan view thereof. In FIGS. 2A and 2B, the microelectromechanical system is now complete and operating.

An external input signal is supplied to a controller by way of a bonding wire 37. The controller, provided on the interconnect region 2 of the substrate 1, performs arithmetic and logical operations, thereby generating a drive signal for each transducer. The transducers to be driven are sequentially scanned and switched. In this case, the gate electrode 38 associated with the fixed electrode 26 functions as a word line, the source electrode 39 functions as a bit line and a predetermined quantity of charge is injected into the selected fixed electrode 26, thereby producing static electricity between the fixed and movable electrodes 33 and tilting the movable electrode 33.

The stopper 27 prevents a short circuit between the movable and fixed electrodes 33 and 26. That is to say, even if the movable electrode 33 has been tilted significantly due to an erroneous operation or external force, the movable electrode 33 never contacts with the fixed electrode 26 directly due to the presence of the stopper 27. As a result, short circuit failures can be eliminated.

As described above, the stopper 27 functions as a stopper for defining via holes in the process step of forming the third conductor layer, as a protective coating to shut off the etchant in the process step of etching the sacrificial layer, and as a film of preventing short circuit between the movable and fixed electrodes 33 and 26 after the system has been completed. Since the single stopper 27 achieves three mutually different effects in these three different process steps, the manufacturing process can be simplified and its reliability can be improved as well.

Figure 3:
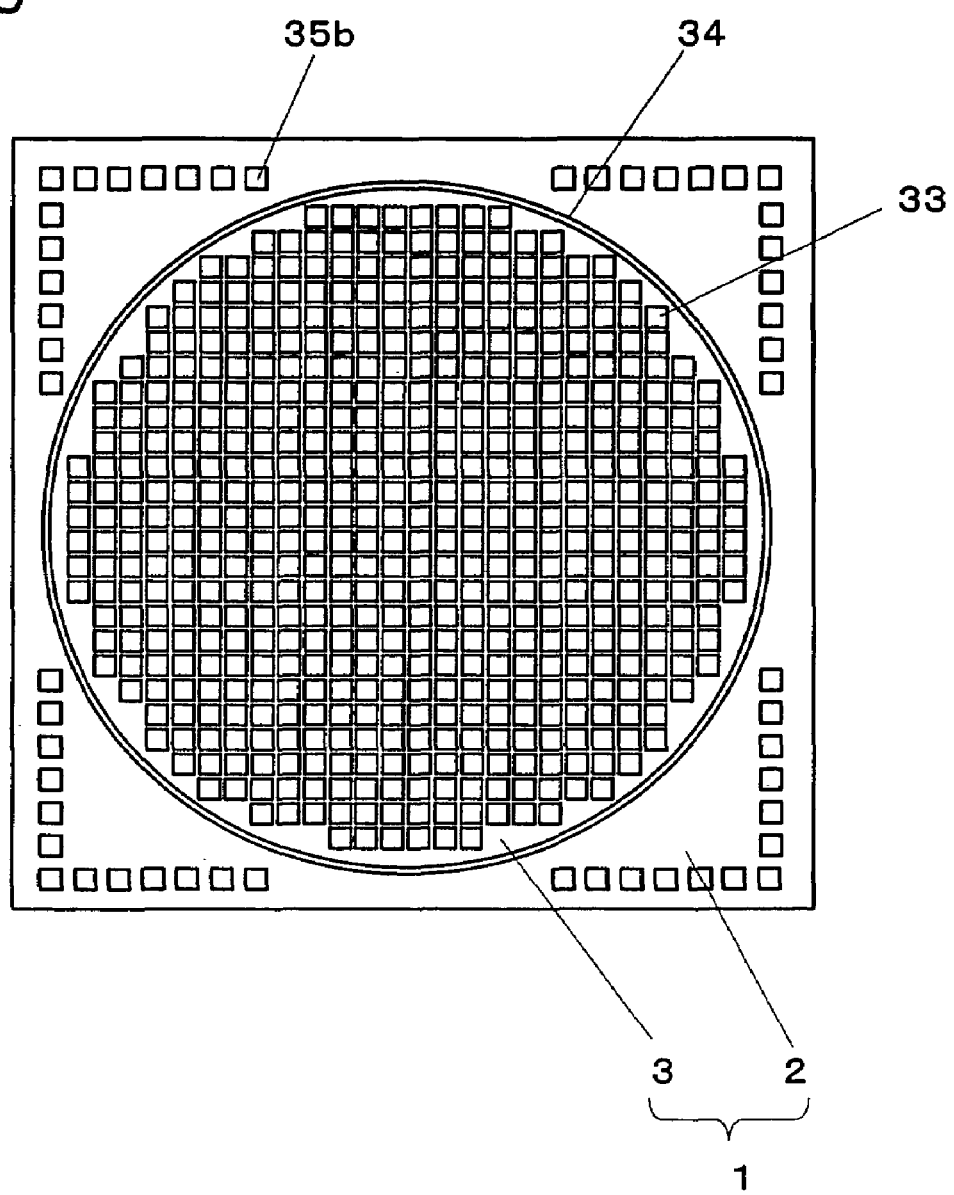
FIG. 3 is a plan view illustrating the microelectromechanical system of the preferred embodiment of the present invention.

FIG. 3 is a plan view illustrating a microelectromechanical system according to this preferred embodiment. In FIG. 3, the silicon wafer has already been diced into respective chips, which have not been packaged yet, though.

The substrate 1 shown in FIG. 3 is a 5 mm×5 mm rectangular substrate, which includes a transducer region 3 with a diameter of about 4.5 mm at the center. In this transducer region 3, a lot of movable electrodes 33 are arranged in columns and rows to define a micromirror array.

An interconnect region 2 is defined outside of the transducer region 3. A number of contact pads 35b are provided in the interconnect region 2. A closed loop barrier wall 34 is provided in the boundary between the interconnect and transducer regions 2 and 3 so as to surround the transducer region 3 and isolate the interconnect and transducer regions 2 and 3 from each other.

In the preferred embodiment described above, the sacrificial layer is etched away before the wafer is diced into respective chips. Accordingly, the barrier wall 34 is provided only in the boundary between the interconnect and transducer regions 2 and 3. Optionally, another closed loop barrier wall 34 in a similar shape may be additionally provided around the chips, too. Then, the sacrificial layer may be etched after the wafer has been diced. This is because by providing the additional closed loop barrier wall around the chips, it is possible to prevent effectively the etchant from entering the chips from their surrounding region.

It should be noted that the barrier wall 34 may also be provided so as to surround the interconnect region 2, too. Also, after the sacrificial layer has been etched away, the barrier wall 34 may be partially removed or cut away.

As described above, in this preferred embodiment, the interconnects are made of a conductor, which includes copper, gold or silver as its main ingredient, while the transducers are made of a material selected from the group consisting of polysilicon, silicon nitride, lead zirconate titanate and silicon carbide. Thus, the best temperature condition, at which no interconnects will be damaged and all transducers can maintain good performance, can be found and the wiring resistance can be reduced, too.

The following effects are further achieved by the preferred embodiment described above.

The conductor includes 0.1 wt % to 1.0 wt % of Ti, Ta, W, Mo or Si, and therefore, the increase in wiring resistance can be checked with the grain growth of the conductor minimized.

Also, the conductor is surrounded with the barrier layer with a thickness of at least 50 nm. Thus, high thermal resistance and reliability is ensured without performing any excessively strict process control.

Moreover, the sacrificial layer is etched away with the barrier wall provided in the boundary between the interconnect and transducer regions on the substrate so as to isolate these regions from each other. Accordingly, even a transducer structure with a complicated shape can be formed easily. In addition, the interconnect region can be fabricated with much more reliability.

Furthermore, at least a portion of the barrier wall is formed simultaneously with the conductor and structure. Thus, no special mask or manufacturing process step is needed just to provide the barrier wall, and the increase in manufacturing cost can be minimized.

Furthermore, the surface of the structure, which has been planarized by the damascene process, is used as an optical reflective surface. Accordingly, the effect of obtaining a desired pattern with excessive portions of the conductor removed and the effect of increasing the reflectance of the optical reflective surface can be achieved at the same time just by performing that damascene process a single time.

Furthermore, the surface of the fixed electrodes, which has also been planarized by the damascene process, is opposed to the movable electrode. Accordingly, the effect of obtaining a desired pattern with excessive portions of the conductor removed and the effect of avoiding excessive concentration of electric field and minimizing dielectric breakdown with the opposed electrode surfaces planarized can be achieved at the same time just by performing that planarizing process a single time.

Furthermore, the structure is obtained by the dual damascene process and has a non-planarized surface that is opposed to the electrode. Thus, the distance accuracy of the gap between the electrode and the structure can be controlled sufficiently precisely and the variation in the performance of the transducers can be reduced significantly.

Furthermore, the conductive protective coating is provided as an integral part of the structure and conductor, thus reducing the resistance of the interconnects and protecting them at the same time.

Furthermore, a film including gold or silver is provided as a material for the conductive protective coating. For that reason, the interconnects can have reduced resistance and consolidated protection, and the optical reflectance of the transducers can be increased, too.

Furthermore, the interlayer dielectric film and interline dielectric film are stacked one upon the other in this order with a stopper, at least a portion of which defines an opening, interposed between them, and that opening is used to pour the etchant to etch away the sacrificial layer for the transducers. Thus, no special mask or manufacturing process step is needed just to provide the opening for pouring the sacrificial layer etchant, and the increase in manufacturing cost can be minimized.

In the preferred embodiment described above, the microelectromechanical system includes a tilt mirror as a transducer. However, the present invention is in no way limited to that specific preferred embodiment. Rather, the transducer may have any other configuration.

Also, in the preferred embodiment described above, the transducer structure is made of polysilicon. Alternatively, the transducer structure may also be made of any other material that needs to be thermally treated at a temperature of 600° C. to 850° C., e.g., silicon nitride, silicon dioxide, lead zirconate titanate or silicon carbide.

A microelectromechanical system according to any of various preferred embodiments of the present invention described above and a method for fabricating such a microelectromechanical system can be used effectively in a micro actuator or micro sensor including an interconnect layer and a transducer. Among other things, the present invention is applicable particularly effectively to a microelectromechanical system that should go through a high-temperature process at 600° C. or more after the interconnect layer has been formed.

While the present invention has been described with respect to preferred embodiments thereof, it will be apparent to those skilled in the art that the disclosed invention may be modified in numerous ways and may assume many embodiments other than those specifically described above. Accordingly, it is intended by the appended claims to cover all modifications of the invention that fall within the true spirit and scope of the invention.

This application is based on Japanese Patent Applications No. 2003-336990 filed Sep. 29, 2003 and No. 2004-244946 filed Aug. 25, 2004, the entire contents of which are hereby incorporated by reference.

What is claimed is:

1. A microelectromechanical system comprising:
    a substrate;
    a transducer supported on the substrate; and
    a conductor layer, which is also supported on the substrate and electrically connected to the transducer,
    wherein the transducer includes a portion made of silicon or a silicon compound, and
    wherein the conductor layer is made of a refractory conductor, which includes, as its main ingredient, at least one element selected from the group consisting of copper, gold and silver, and
    wherein at least a portion of the conductor layer is located at an intermediate level between the silicon or silicon compound portion of the transducer and the substrate.

2. The microelectromechanical system of claim 1, wherein the transducer includes:
a structure including the silicon or silicon compound portion; and
a gap surrounding the structure, and
wherein a portion of the conductor layer is located under the structure.

3. The microelectromechanical system of claim 1, wherein the silicon or silicon compound portion of the transducer is made of polysilicon, silicon nitride, lead titanate zirconate and/or silicon carbide.

4. The microelectromechanical system of claim 1, wherein the refractory conductor includes from 0.1 wt % to 1.0 wt % of Ti, Ta, W, Mo or Si.

5. The microelectromechanical system of claim 1, wherein the surface of the refractory conductor is covered with a barrier layer with a thickness of at least 50 nm.

6. The microelectromechanical system of claim 5, wherein the barrier layer includes a metal selected from the group consisting of Ti, W, Ta and Re.

7. The microelectromechanical system of claim 5, wherein the barrier layer includes a nitride or a silicide of a metal selected from the group consisting of Ti, W, Ta and Re.

8. The microelectromechanical system of claim 1, wherein the conductor layer includes an interconnection pattern, and
wherein the interconnection pattern has a minimum line width of 0.35 μm.

9. The microelectromechanical system of claim 8, wherein the interconnection pattern of the conductor layer includes an upper-level interconnect portion and a lower-level interconnect portion, which are provided at mutually different levels.

10. A microelectromechanical system comprising
a substrate and
a interconnect region and a transducer region, which are both supported on the substrate,
wherein the interconnect region includes a plurality of conductors and an insulator provided between the conductors, and
wherein the transducer region includes at least one transducer, and
wherein the transducer includes a structure and a gap surrounding the structure, and
wherein the microelectromechanical system further includes a barrier wall, which is provided in a boundary between the interconnect region and the transducer region so as to isolate the insulator from the gap.

11. The microelectromechanical system of claim 10, wherein the insulator of the interconnect region is an unetched portion of an insulating film, which remains after the gap has been formed by etching away a portion of the insulating film functioning as a sacrificial layer.

12. The microelectromechanical system of claim 11, wherein the barrier wall is made of a material that works as a barrier against an etchant that etches the insulating film.

13. The microelectromechanical system of claim 10, wherein the barrier wall hermetically separates the interconnect region from the transducer region.

14. The microelectromechanical system of claim 10, wherein at least a portion of the barrier wall is made of the same material as the conductor and/or the structure.

15. The microelectromechanical system of claim 10, wherein at least a portion of the conductor is made of the same material as the structure.

16. The microelectromechanical system of claim 10, wherein the conductor and the structure are formed simultaneously by a damascene process.

17. The microelectromechanical system of claim 16, wherein the surface of the structure is planarized so as to function as an optical reflective surface.

18. The microelectromechanical system of claim 10, wherein the transducer further includes an electrode to drive the structure, and
wherein the surface of the electrode is planarized by the damascene process and opposed to the structure with the gap provided between the electrode and the structure.

19. The microelectromechanical system of claim 18, wherein the structure is formed by a dual damascene process, and
wherein the surface of the structure that is opposed to the electrode functions as a non-planarized surface.

20. The microelectromechanical system of claim 10, further comprising a conductive protective coating, which forms an integral part of the structure and/or the conductor.

21. The microelectromechanical system of claim 20, wherein the conductive protective coating includes gold and/or silver.

* * * * *